(12) United States Patent
Hillis et al.

(10) Patent No.: US 7,542,133 B2
(45) Date of Patent: Jun. 2, 2009

(54) PHOTO-DETECTOR FILTER

(75) Inventors: W. Daniel Hillis, Encino, CA (US); Roderick A. Hyde, Livermore, CA (US); Nathan P. Myhrvold, Medina, WA (US); Lowell L. Wood, Jr., Livermore, CA (US)

(73) Assignee: Searete, LLC, Bellevue, WA (US)

( * ) Notice: Subject to any disclaimer, the term of this patent is extended or adjusted under 35 U.S.C. 154(b) by 172 days.

(21) Appl. No.: 11/236,414

(22) Filed: Sep. 27, 2005

(65) Prior Publication Data

US 2006/0087646 A1   Apr. 27, 2006

Related U.S. Application Data

(63) Continuation-in-part of application No. 10/744,057, filed on Dec. 22, 2003, now Pat. No. 7,053,998, and a continuation-in-part of application No. 10/744,058, filed on Dec. 22, 2003, now Pat. No. 7,098,439.

(51) Int. Cl.
*G01J 1/42* (2006.01)
(52) U.S. Cl. .................. 356/218; 356/213; 356/432; 250/208.1; 250/208.2; 250/226
(58) Field of Classification Search ................ 356/218, 356/313, 213, 432; 250/208.1, 208.2, 226, 250/214.1
See application file for complete search history.

(56) References Cited

U.S. PATENT DOCUMENTS

| | | | |
|---|---|---|---|
| 4,238,760 A | 12/1980 | Carr | |
| H101 H | 8/1986 | Walker | |
| 4,945,242 A | 7/1990 | Berger et al. | |
| 5,011,295 A * | 4/1991 | Krishnan et al. | ............ 374/126 |
| 5,216,384 A | 6/1993 | Vanhecke | |
| 5,286,990 A | 2/1994 | Hynecek | |
| 5,416,326 A | 5/1995 | Andreotti | |
| 5,561,287 A | 10/1996 | Turner et al. | |
| 5,854,574 A | 12/1998 | Singer et al. | |
| 5,864,146 A | 1/1999 | Karellas | |
| 5,965,875 A | 10/1999 | Merrill | |
| 6,114,910 A | 9/2000 | Goff | |
| 6,246,345 B1 | 6/2001 | Davidson et al. | |
| 6,278,142 B1 | 8/2001 | Hynecek | |
| 6,300,612 B1 | 10/2001 | Yu | |
| 6,395,576 B1 | 5/2002 | Chang et al. | |
| 6,501,400 B2 | 12/2002 | Ali | |
| 6,509,575 B1 * | 1/2003 | Nanni | ........................ 356/443 |

(Continued)

FOREIGN PATENT DOCUMENTS

JP    06319042 A    11/1994

(Continued)

OTHER PUBLICATIONS

U.S. Appl. No. 11/601,380, Hillis et al.

(Continued)

*Primary Examiner*—L. G Lauchman
*Assistant Examiner*—Iyabo S Alli

(57) ABSTRACT

Method and systems related to obstructing a first predefined portion of at least one defined wavelength of light incident upon a first photo-detector array; and detecting the at least one defined wavelength of light with a photo-detector in a second photo-detector array.

31 Claims, 4 Drawing Sheets

U.S. PATENT DOCUMENTS

| | | | |
|---|---|---|---|
| 6,632,701 | B2 | 10/2003 | Merrill |
| 7,053,809 | B2 | 5/2006 | Hillis et al. |
| 7,053,998 | B2 | 5/2006 | Hillis et al. |
| 7,123,844 | B2 * | 10/2006 | Myrick ................ 398/192 |
| 7,250,595 | B2 | 7/2007 | Hillis et al. |
| 7,378,634 | B2 | 5/2008 | Tower et al. |
| 2002/0003201 | A1 | 1/2002 | Yu |
| 2002/0030544 | A1 | 3/2002 | Kulhalli et al. |
| 2004/0119477 | A1 | 6/2004 | Kazemi-Nia |

FOREIGN PATENT DOCUMENTS

| | | | |
|---|---|---|---|
| JP | | 2003/163556 A | 6/2003 |

OTHER PUBLICATIONS

U.S. Appl. No. 11/598,208, Hillis et al.

U.S. Appl. No. 11/303,182, Hillis et al.

U.S. Appl. No. 10/758,950, Hillis et al.

Andor Technology Website link: Andor-tech.com\low light imaging\ixon\EMCCD- "The iXon CCDs featuring EM technology are the most sensitive imaging detectors ever!" Printed on Feb. 26, 2004.

Black, Brian, Analog-to-Digital Converter Architectures and Choices for System Design, Analog Dialogue 33-8 (1999), pp. 1-4.

Coates, Colin G.; Denvir, Donal J.; Conroy, Emer; McHale, Noel; Thornbury, Keith; Hollywood, Mark; "Back-illuminated electron multiplying technology: The world's most sensitive CCD for ultra low-light microscopy"; pp. 1-10, date unknown.

Davidson, Michael W., Abramowitz, Mortimer, et al., "Digital Imaging in Optical Microscopy" at www.micro.magnet.fsu.edu/primer/digitalimaging/digitalimagebasics.html; Bearing a date of Aug. 1, 2003; Printed on Feb. 23, 2004. pp. 1-17.

Denvir, Donal J., et al., Electron Multiplying CCDs, Andor Technology Ltd. UK at www.andor-tech.com; Printed on Feb. 26, 2004; pp. 1-14.

Foveon Brochure, copyright 2002 Foveon, Inc.—website: www.foveon.com; pp. 1-8.

Lyon, Richard F., Foveon X3 Slides from Chief Scientist Richard F. Lyon's talks regarding Color Photography with Foveon X3 Sensor Technology; pp. 1-49.

PCT International Search Report; International App. No. PCT/US04/41041; Sep. 22, 2005.

* cited by examiner

PHOTO-DETECTOR FILTER

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith. The United States Patent Office (USPTO) has published a notice to the effect that the USPTO's computer programs require that patent applicants reference both a serial number and indicate whether an application is a continuation or continuation in part (see PTO *Gazette Notice* 18 Mar. 2003, "*Benefit of Prior-Filed Application*"). The present applicant entity has provided below a specific reference to the application(s) from which priority is being claimed as recited by statute. Applicant entity understands that the statute is unambiguous in its specific reference language and does not require either a Ser. No. or any characterization such as "continuation" or "continuation-in-part." Notwithstanding the foregoing, applicant entity understands that the USPTO's computer programs have certain data entry requirements, and hence applicant entity is designating the present application as a continuation in part of its parent applications, but expressly points out that such designations are not to be construed in any way as any type of commentary and/or admission as to whether or not the present application contains any new matter in addition to the matter of its parent application(s).

Related Applications

1. For purposes of the USPTO extra-statutory requirements, the present application constitutes a continuation in part of currently co-pending U.S. patent application entitled PHOTO-DETECTOR FILTER, naming W. Daniel Hillis; Roderick A. Hyde; Nathan P. Myhrvold; and Lowell L. Wood Jr. as inventors, U.S. application Ser. No. 10/744,057 filed 22 Dec. 2003 now U.S. Pat. No. 7,053,998, which is currently co-pending, or is an application of which a currently co-pending application is entitled to the benefit of the filing date.
2. For purposes of the USPTO extra-statutory requirements, the present application constitutes a continuation in part of currently co-pending U.S. patent application entitled AUGMENTED PHOTO-DETECTOR FILTER, naming W. Daniel Hillis, Roderick A. Hyde; Nathan P. Myhrvold, and Lowell L. Wood Jr. as inventors, U.S. application Ser No. 10/744,058 filed 22 Dec. 2003 now U.S. Pat. No 7,098,439, which is currently co-pending, or is an application of which a currently co-pending application is entitled to the benefit of the filing date.

TECHNICAL FIELD

The present application relates, in general, to photo-detector systems.

SUMMARY

In one aspect, a system includes but is not limited to: a first photo-detector array configured to obstruct a first predefined portion of at least one defined wavelength of light impinging upon said first photo-detector array; and a second photo-detector array sensitive to the at least one defined wavelength of light, said second photo-detector array positioned proximate to said first photo-detector array. Other related system aspects are shown and described elsewhere herein.

In one aspect, a method of constructing a system includes but is not limited to: forming a first photo-detector array configured to obstruct a first predefined portion of at least one defined wavelength of light impinging thereupon; and forming a second photo-detector array sensitive to the at least one defined wavelength of light in a vicinity of the first photo-detector array. Other related method aspects are shown and described elsewhere herein.

In one aspect, a method of detecting light includes but is not limited to: obstructing a first predefined portion of at least one defined wavelength of light incident upon a first photo-detector array; and detecting the at least one defined wavelength of light with a photo-detector in a second photo-detector array.

In one or more various aspects, related systems include but are not limited to circuitry and/or programming for effecting the method aspects described in the text and/or drawings of the present application; the circuitry and/or programming can be virtually any combination of hardware, software, and/or firmware configured to effect the foregoing-referenced method aspects depending upon the design choices of the system designer.

Various other method and or system aspects are set forth and described in the text (e.g., claims and/or detailed description) and/or drawings of the present application.

The foregoing is a summary and thus contains, by necessity; simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE FIGURES

The use of the same symbols in different drawings typically indicates similar or identical items.

DETAILED DESCRIPTION

Figure 1:
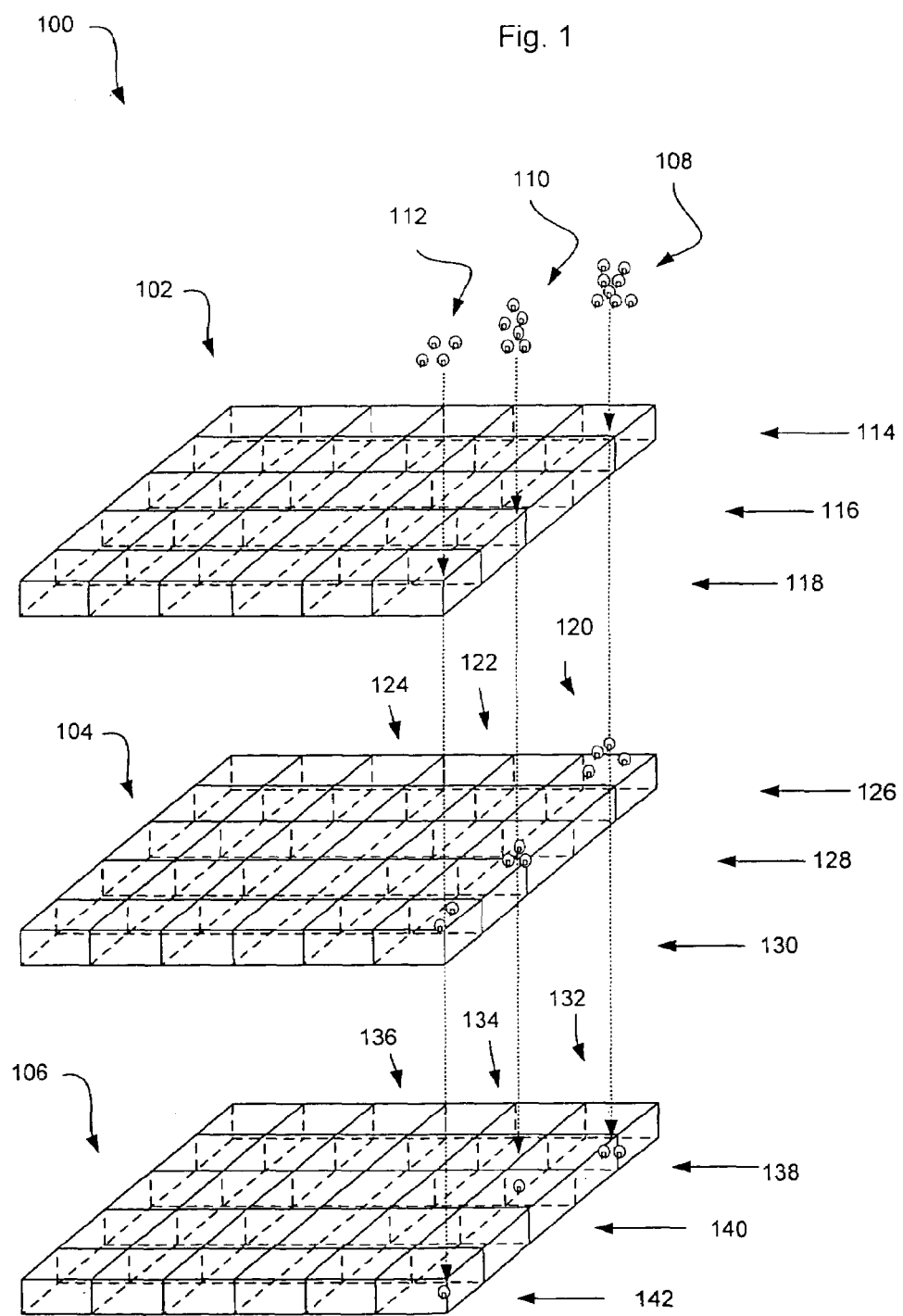
FIG. 1 shows structure 100 that includes photo-detector arrays 102, 104, and 106.

With reference to the Figures, and with reference now to FIG. 1, shown is structure 100 that includes photo-detector arrays 102, 104, and 106. Example implementations of photo-detector arrays 102, 104, and 106 include but are not limited to charge coupled device (CCD) sensor arrays, complementary metal oxide semiconductor (CMOS) sensor arrays, and/or mixtures of CCD and CMOS arrays. Those having skill in the art may substitute other suitable types of photo-detector arrays in view of the teachings herein with a reasonable amount of experimentation.

Photon groups 108, 110, and 112 are depicted as respectively impinging upon photo-detectors 114, 116, and 118 of photo-detector array 102. Photo-detector array 102 is depicted as configured to obstruct a predefined portion of at least one defined wavelength of light impinging upon photo-detector array 102. As one specific example, photo-detectors 114, 116, and 118 of photo-detector array 102 are illustrated as obstructing ½, or 50%, of the photons of photon groups 108, 110, and 112 impinging upon photo-detector array 102. (While the examples herein are shown in terms of integral numbers of photons for clarity of presentation, those skilled in the art will recognize that other relative measures of brightness, intensity, power density, and/or other properties of light exist; specifically, those having skill in the art will recognize that the response of specific devices may operate on a square law format, straight linear format, or other format.) Those skilled in the art will recognize that the obstruction level of 50% discussed herein is illustrative only, and that different obstruction levels are possible. Similarly, those skilled in the art will recognize that the obstruction level may be chosen to be different in some or all of the specific photodetectors.

Unobstructed portions 120, 122, 124 of photon groups 108, 110, and 112, respectively, are shown impinging upon photo-detectors 126, 128, and 130 of photo-detector array 104. Photo-detector array 104 is depicted as configured to obstruct a predefined portion of at least one defined wavelength of light impinging upon photo-detector array 104. As one specific example, photo-detectors 126, 128, and 130 of photo-detector array 104 are illustrated as obstructing ½, or 50%, of the photons of portions 120, 122, and 124 of light impinging upon photo-detector array 104.

Unobstructed portions 132, 134, and 136 of portions 120, 122, and 124, respectively, are shown impinging upon photo-detectors 138, 140, and 142 of photo-detector array 106. Photo-detector array 106 is depicted as configured to obstruct a predefined portion of at least one defined wavelength of light impinging upon photo-detector detector array 106. As one specific example, photo-detectors 138, 140, and 142 of photo-detector array 106 are illustrated as obstructing ½, or 50%, of the photons of portions 132, 134, and 136 impinging upon photo-detector array 106.

There are multiple advantages arising from structure 100. A few of these advantages will now be explicitly discussed in the context of processes shown and/or described in relation to FIGS. 2 and 3. For example, insofar as the predetermined portions obstructed and/or unobstructed by photo-detector arrays 102, 104, and 106 are known, the array levels at which light is detected will allow strong inferences to be made as to the intensity of photon groups 108, 110, and 112 respectively impinging upon photo-detectors 114, 116, and 118 of photo-detector array 102. Another advantage is that, insofar as photo-detector arrays 102, 104, and 106 are layered, the various layers may provide for more accuracy. Yet another advantage is that, insofar as photo-detector arrays 102, 104, and 106 are layered, the various layers may extend the dynamic range far beyond the saturation point of the photo-detectors in upper level photo-detectors, such as the photo-detectors in photo-detector array 102.

Figure 2:
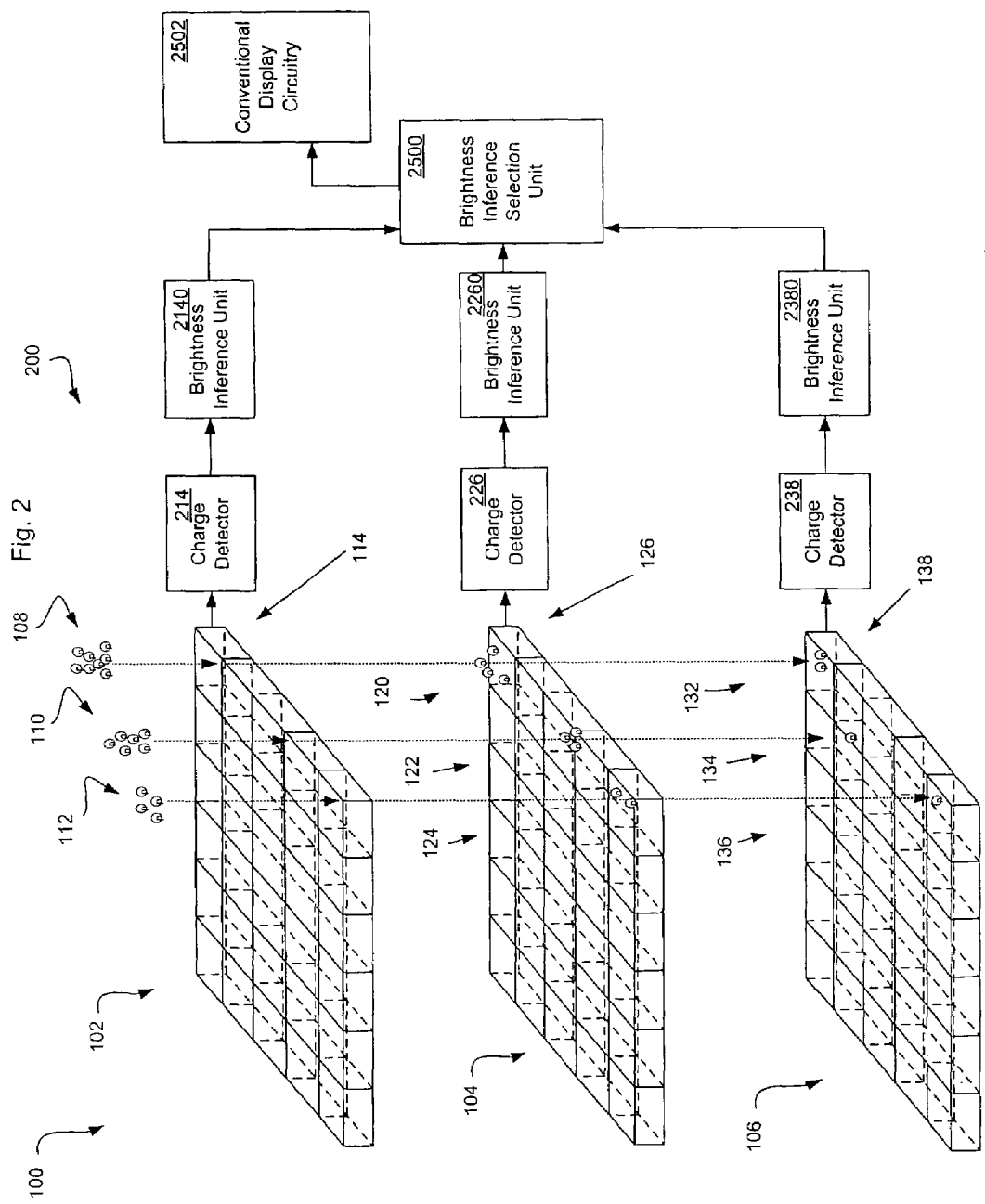
FIG. 2 depicts system 200 that includes the subject matter shown in FIG. 1.

Referring now to FIG. 2, depicted is system 200 that includes the subject matter shown in FIG. 1. System 200 may form an environment for a process that serves to illustrate a few of the advantages of structure 100. As a specific example, shown following is that, in the event that the photo-detectors of photo-detector arrays 102, 104, and 106 are such that they saturate after the incidence of 6 photons, structure 100 will allow an image to be gathered that exceeds the saturation point of the photo-detectors of uppermost photo-detector array 102. Specifically, although the photo-detectors saturate after 6 photons, the example of FIG. 2 shows that intensity at photo-detector array 102 can be inferred beyond the dynamic range of photo-detector array 102.

Charge detectors 238, 226, and 214 are shown as coupled to detect the charge in photo-detectors 138, 126, and 114, respectively. Brightness inference units 2380, 2260, and 2140 are shown as coupled to calculate the intensity indicated by charge detectors 238, 226, and 214, respectively. Although only a few specific charge detector-brightness inference unit combinations are shown and described herein, those having skill in the art will recognize that, in most implementations, generally most photodetectors in use will be coupled to one or more similar charge detector-brightness inference unit combinations, which will thereafter couple with one or more brightness inference selection units 2500. Those having skill in the art will recognize that the teaching herein can be extended to virtually all suitable photo-detector arrays, including but not limited to Vertical, Linear, Interline, Full-frame, and Frame-transfer arrays via a reasonable amount of experimentation. The conventional aspects of such photo-detector architectures are not described herein for sake of brevity.

Charge detector 238 is depicted as coupled to detect the charge in photo-detector 138. Charge detector 238 is further shown as coupled to brightness inference unit 2380. Brightness inference unit 2380 has knowledge of photo-detector 106's relative place in the stack and the predetermined light obstruction/unobstruction characteristics of the photo-detectors in the stack above photo-detector 106. Accordingly, brightness inference unit 2380 can calculate a likely intensity of photon-group 108 impinging on uppermost photo-detector array 102. As a specific example, the fact that photo-detector 126 of photo-detector array 104 is known to obstruct ½, or 50%, of its incident photons—coupled with the information from charge detector 238 that 2 photons have impinged upon photo-detector 138—allows brightness inference unit 2380 to calculate that approximately four photons were incident upon photo-detector 126. Brightness inference unit 2380 can thereafter use this 4-photon inference coupled with the fact that photo-detector 114 of photo-detector array 102 is known to obstruct ½, or 50%, of its incident photons to calculate that approximately 8 photons were incident upon photo-detector 114.

Charge detector 226 and brightness inference unit 2260 are depicted as working in a fashion similar to charge detector 238 and brightness inference unit 2380 to calculate that the 4 photons received by photo-detector 126 indicate that approximately 8 photons were received by photo-detector 114.

Charge detector 214 and brightness inference unit 2140 are illustrated as working in a fashion similar to charge detector 238 and brightness inference unit 2380 to calculate that the 8 photons received by photo-detector 114 indicate that approximately 6 photons were received by photo-detector 114, since photo-detector 114—for sake of example—is assumed to saturate at 6 photons.

Brightness inference selection unit 2500 is shown as coupled to receive the results of brightness inference units 2380, 2260, and 2140. Brightness inference selection unit 2500 runs various selection routines to determine which of brightness inference units 2380, 2260, and 2140 are likely most accurate. Continuing with the present example, brightness inference selection unit 2500 would note that brightness inference unit 2140's calculation was at the threshold saturation point of photo-detector 114, and would mark that calculation as suspect. Thereafter, brightness inference selection unit 2500 would note that brightness inference unit 2260's and 2380's calculations were below the threshold saturation point of photo-detector 114. Consequently, brightness inference selection unit 2500 would average brightness inference unit 2260's and 2380's calculations (ignoring brightness inference unit 2140's at-threshold calculation) to get a brightness inference of 8 photons.

Brightness inference selection unit 2500 is depicted as coupled to conventional display circuitry 2502. Conventional display circuitry 2502 typically expects to receive one of a number of discrete signals indicative of pixel brightness (what those signals are constitutes a conventional design choice). Continuing with the present example, brightness inference selection unit 2500 generates a signal indicative of 8 photon brightness and delivers that signal over to conventional display circuitry 2502, which then uses the signal in a conventional fashion to produce an image representation.

Figure 3:
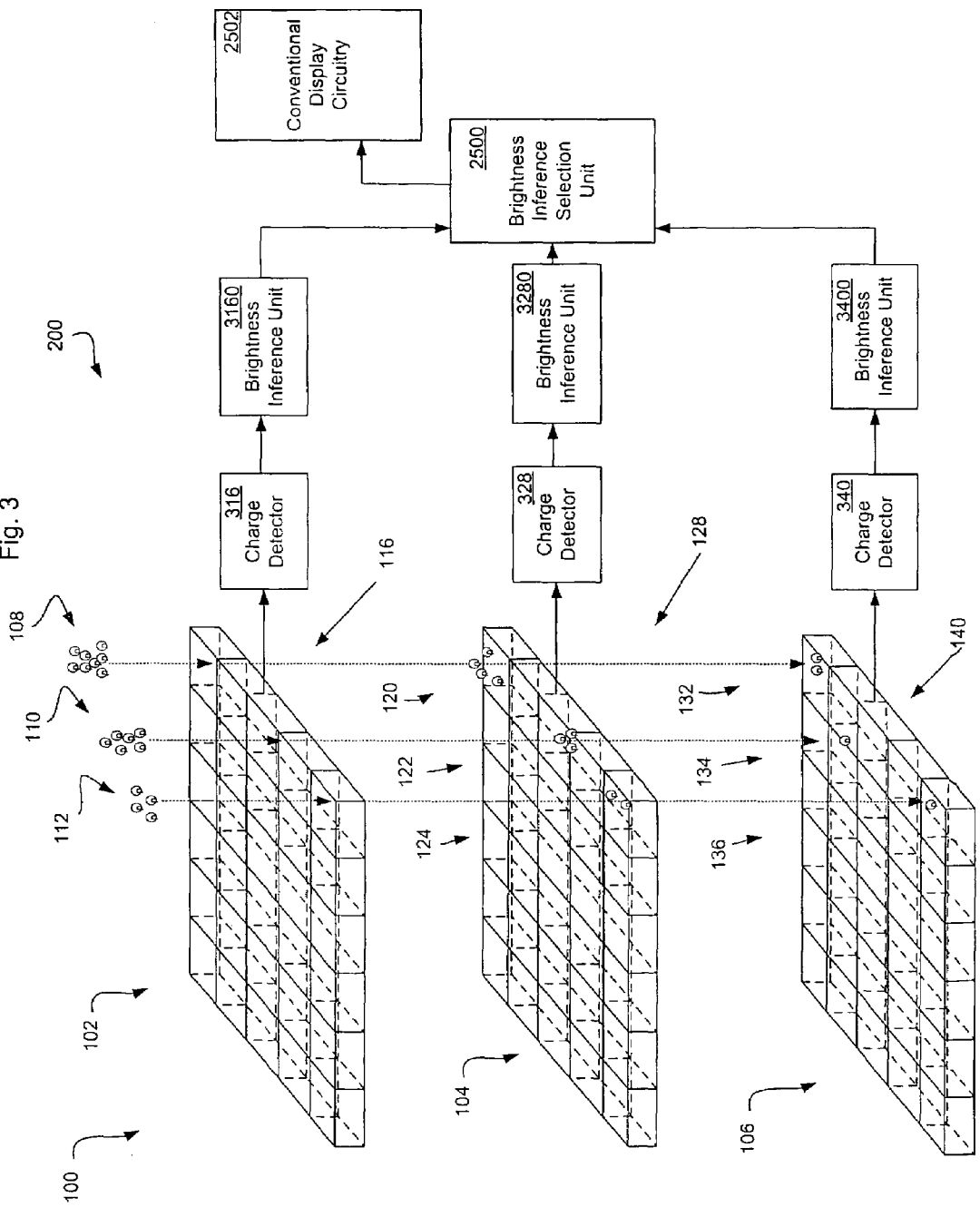
FIG. 3 depicts system 200 that includes the subject matter shown in FIG. 1.

With reference now to FIG. 3, depicted is system 200 that includes the subject matter shown in FIG. 1. System 200 may form an environment for a process that serves to illustrate a few of the advantages of structure 100. As a specific example, shown following is that, in the event that photon group 110 is such that there is "quantization error" introduced by the filtering photo-detectors, the fact that there are multiple layers of filters allows system 200 to increase the likelihood that such "quantization errors" can be corrected.

Charge detector 340 is depicted as coupled to detect the charge in photo-detector 140. Charge detector 340 is further shown as coupled to brightness inference unit 3400. Brightness inference unit 3400 has knowledge of photo-detector array 106's (e.g., photo-detector 140's) relative place in the stack and the predetermined light obstruction/unobstruction characteristics of the photo-detectors in the stack above photo-detector array 106 (photo-detector 140). Accordingly, brightness inference unit 3400 can calculate a likely intensity of photon-group 110 impinging on uppermost photo-detector array 102. As a specific example, the fact that photo-detector 128 of photo-detector array 104 is known to obstruct ½, or 50%, of its incident photons—coupled with the information from charge detector 340 that 1 photon has impinged upon photo-detector 140—allows brightness inference unit 3400 to calculate that approximately 2 photons were incident upon photo-detector 128; unfortunately, since the 1 photon impinging upon photo-detector 140 is the result of photo-detector 128 filtering 50% of 3 photons, there is quantization error in the filtering which makes this calculated intensity of the light at photo-detector array 104 less accurate than without the quantization error. Brightness inference unit 3400 can thereafter use this 2-photon inference coupled with the fact that photo-detector 116 of photo-detector array 102 is known to obstruct ½, or 50%, of its incident photons to calculate that approximately 4 photons were incident upon photo-detector 116.

Charge detector 328 and brightness inference unit 3280 are depicted as working in a fashion similar to charge detector 340 and brightness inference unit 3400. Brightness inference unit 3280 has knowledge of photo-detector array 104's (e.g., photo-detector 128's) relative place in the stack and the predetermined light obstruction/unobstruction characteristics of the photo-detector in the stack above photo-detector 104 (e.g., photo-detector 128). Accordingly, brightness inference unit 3280 can calculate a likely intensity of photon-group 110 impinging on uppermost photo-detector array 102. Continuing with the present example, the fact that photo-detector 116 of photo-detector array 102 is known to obstruct ½, or 50%, of the photons, coupled with the information from charge detector 328 that 3 photons has impinged upon photo-detector 128 allows brightness inference unit 3280 to calculate that approximately 6 photons were incident upon photo-detector 116. Brightness inference unit 3280 can thereafter use this 6-photon inference coupled with the fact that photo-detector 116 of photo-detector array 102 is known to obstruct ½, or 50%, of the photons to calculate that approximately 6 photons were incident upon photo-detector 116.

Charge detector 316 and brightness inference unit 3160 are illustrated as working in a fashion similar to charge detector 340 and brightness inference unit 3400 to calculate that the 6 photons received by photo-detector 116 indicate that approximately 6 photons were received by photo-detector 116.

Brightness inference selection unit 2500 is shown as coupled to receive the results of brightness inference units 3400, 3280, and 3160. Brightness inference selection unit 2500 runs various selection routines to determine which of brightness inference units 3400, 3280, and 3160 are likely most accurate. Continuing with the present example, brightness inference selection unit 2500 would note that brightness inference unit 3160's calculation was at the threshold saturation point of photo-detector 114, and would mark that calculation as suspect. Thereafter, brightness inference selection unit 2500 would note that brightness inference unit 3280's and 3400's calculations do not agree. Consequently, brightness inference selection unit 2500 would detect that brightness inference unit 3280's calculation matched brightness inference unit 3160's calculation, even though brightness inference unit 3160's calculation shows a threshold saturation value; accordingly, brightness inference selection unit would treat brightness inference unit 3160's calculation as accurate and then average all three calculations of brightness inference units 3400, 3280, and 3160 (e.g., (4+6+6)/3=5.33) to select a brightness inference of 6 photons as most likely; alternatively, the fact that brightness inference unit 3280 makes its threshold inference based on more collected charge (e.g., as indicated by charge detector 328) than the charge collected by lowermost brightness inference unit 3400 could be used to decide that brightness inference unit 3280's was the more accurate. Those having skill in the art will appreciate other selection routines in light of the teachings herein.

Photo-detector arrays 102, 104, 106 have been described herein as configured to obstruct predefined portions of at least one defined wavelength of light impinging upon photo-detector arrays 102, 104, 106. There are many different ways in which such photo-detector arrays may be implemented. In some implementations of the photo-detector arrays, at least one photo-detector is constructed to provide an optical filter having a passband including at least one of a red, a blue, and a green visible light wavelength. Exemplary implementations include photo-detectors constructed to filter red, blue, and green visible light wavelengths either individually or in some combination thereof. Other exemplary implementations include photo-detectors constructed to filter 400 through 800 nm wavelengths of light either individually or in some combination thereof.

In other implementations of the photo-detector arrays, at least one photo-detector is constructed to provide a substantially neutral density filter (neutral density filters attenuate incident light without significantly altering its spectral distribution over a defined group of wavelengths of interest). In one exemplary implementation, one or more photo-detectors are constructed to provide a neutral density filter that decreases an intensity of light energy without substantially altering a relative spectral distribution of an unobstructed portion of the light energy. In another exemplary implementation, one or more photo-detectors are constructed to provide a substantially neutral density filter that filters an entire visible spectrum substantially evenly without substantially influencing at least one of color and contrast of an unobstructed portion of the entire visible spectrum. In another exemplary implementation, one or more photo-detectors are constructed to provide a substantially neutral density filter that utilizes at least one of absorption and reflection. In another exemplary implementation, one or more photo-detectors are constructed to provide a substantially neutral density filter that filters substantially ½ of the light impinging upon the photo-detectors. In another exemplary implementation, one or more photo-detectors are constructed to provide a substantially neutral density filter that filters a defined portion of photons at least partially composing the light impinging upon said first photo-detector. The examples herein are not intended to be exhaustive, and those having skill in the art may substitute other types of photo-detector arrays in view of the teachings herein with a reasonable amount of experimentation.

Figure 4:
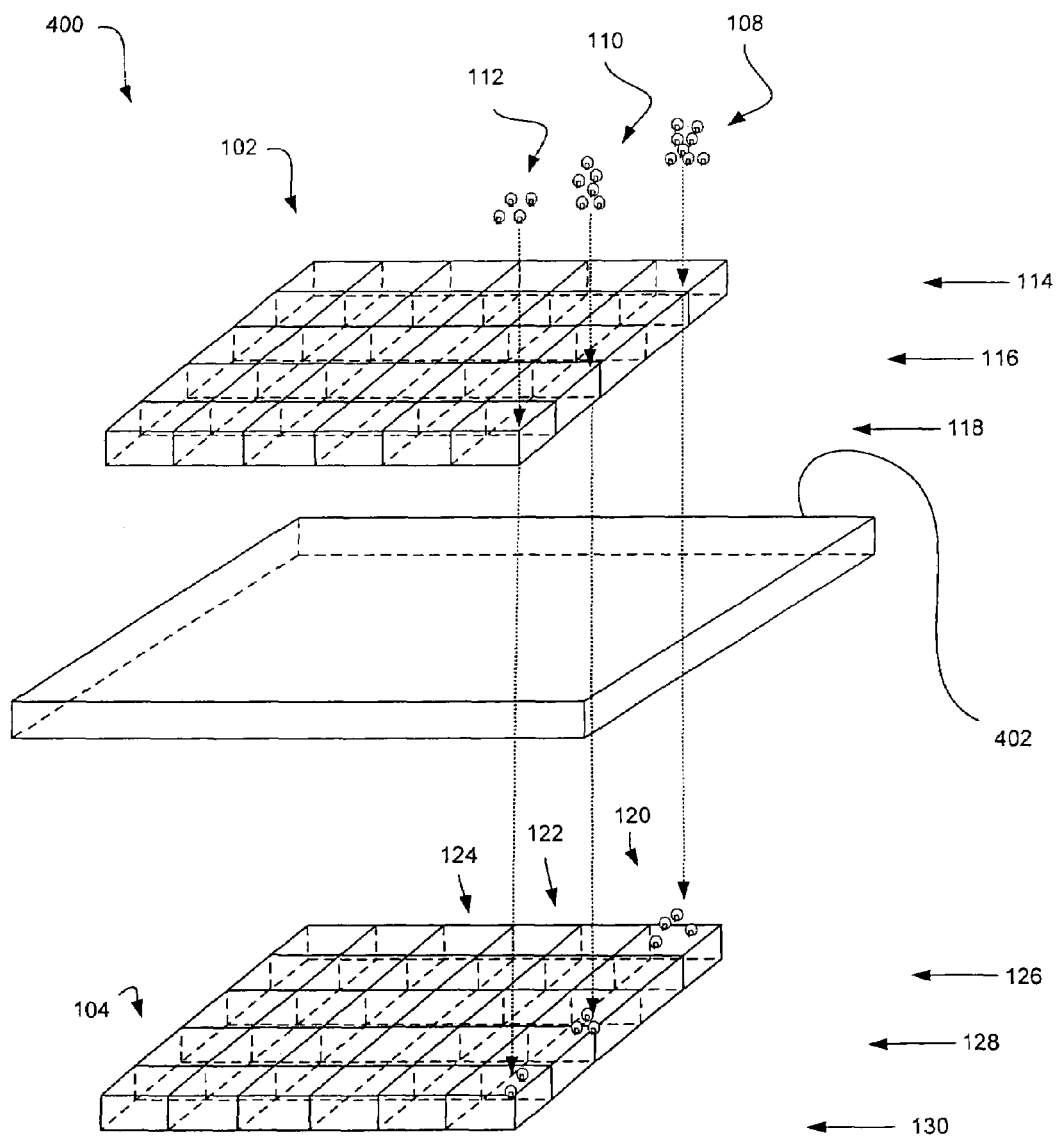
FIG. 4 shows structure 400 that constitutes an alternate implementation of structure 100.

Referring now to FIG. 4, shown is structure 400 that constitutes an alternate implementation of structure 100. Spectrally dependent filter 402 is depicted interposed between photo-detector array 102 and photo-detector array 104. Those skilled in the art will recognize that spectrally-dependent filter 402 can be either monolithic (as shown in FIG. 4), or can be spatially differentiated using either the same pixilation pattern as in photo-detector arrays 102 or 104, or using a different pattern. Although only two photo-detector arrays and one spectrally-dependent filter are shown in FIG. 4, structure 400 is intended to be representative of its shown components repeated many times, and is also intended to be representative of a composite of structures 100 of FIG. 1 and structure 400 of FIG. 4. In addition, although not explicitly shown, it will be appreciated by those having skill in the art that FIGS. 2 and 3 can be modified to include and utilize the subject matter of FIG. 4 with a routine amount of experimentation.

In one implementation, spectrally dependent filter 402 can be depicted interposed between photo-detector array 102 and photo-detector array 104. Spectrally dependent filter is used to equalize the filtering of photo-detector array 102 so that the various wavelengths of portions 120, 122, 124 have been like filtered prior to impinging upon photo-detector 104. For example, in some implementations, photo-detector array 102 will not provide a true neutral density filter function across red, blue, and green wavelength light. Specifically, assume that photo-detector 102 allowed 50% of the red and blue light to pass but allowed 60% of the green light to pass. In such a situation, spectrally-dependent filter 402 would provide an additional green filter so that the red, blue, and green light were all filtered approximately 50% when they reached photo-detector 104.

In another implementation, spectrally dependent filter 402 can be designed to attenuate at least one first wavelength (e.g., blue light) substantially more than at least one second wavelength (e.g., red light). In such a situation, the difference between signals detected by photo-detector array 104 and photo-detector array 102, can be used to determine the spectral composition of light impinging upon the device 400.

In another example implementation of spectrally-dependent filter 402, spectrally-dependent filter 402 is constructed to filter at least one defined wavelength of light between about 400 and about 800 nano-meters.

In one example implementation of structure 400, photo-detector arrays proximate to each other are constructed of different semi-conductor materials.

In another example implementation of structure 400, spectrally-dependent filter 402 is made from a semi-conductor material that is the same as the material used in at least one of the first and second photo-detector arrays, the semiconductor material having at least one of a doping material and a concentration chosen to meet a predefined amount of optical obstruction; in an alternate implementation, the material is different from that of a photo-detector array proximate to spectrally-dependent filter 402.

In another example implementation of structure 400, spectrally-dependent filter 402 provides its filtering/obstruction properties via at least one of absorption and reflection mechanisms.

In another example implementation of structure 400, spectrally-dependent filter 402 provides an amount of obstruction substantially different for at least one second defined wavelength of light than for the at least one defined wavelength of light which photo-detector 102 has been configured to obstruct.

In another example implementation of structure 400, spectrally-dependent filter 402 provides an amount of obstruction substantially the same for a defined set of wavelengths, the set containing the first defined wavelength of light.

In another example implementation of structure 400, at least one photo-detector in a photo-detector array substantially matches at least one of the size, shape, and lateral location of at least one photo-detector in another photo-detector array.

In another example implementation of structure 400, at least one photo-detector in one photo-detector array is in respective substantial alignment with a plurality of photo-detectors in another photo-detector array.

In another example implementation of structure 400, the photo-detector arrays are each permeable to a first and a second defined wavelength of light.

In another example implementation of structure 400, structure 400 contains a set of N+1 photo-detector arrays, each pair of which is proximate to and separated by an optical filter, such that relative optical spectrums entering N of the photo-detector arrays are substantially different from each other, and such that a relative optical spectrum entering photo-detector array N+1 has a substantially similar relative spectrum as that relative spectrum entering the first photo-detector array.

The foregoing detailed description has set forth various embodiments of the devices and/or processes via the use of block diagrams, flowcharts, and examples. Insofar as such block diagrams, flowcharts, and examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. In one embodiment, the present invention may be implemented via Application Specific Integrated Circuits (ASICs), Field Programmable Gate Arrays (FPGAs), or other integrated formats. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one skilled in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various embodiments described herein which can be implemented, individually and/or collectively, by various types of electro-mechanical systems having a wide range of hardware, software, firmware, or virtually any combination thereof. Consequently, as used herein "electrical system" includes, but is not limited to, electrical circuitry operably coupled with a transducer (e.g., an actuator, a motor, a piezoelectric crystal, etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs.

Those skilled in the art will recognize that it is common within the art to describe devices and/or processes in the fashion set forth herein, and thereafter use standard engineering practices to integrate such described devices and/or processes into image processing systems. That is, at least a portion of the devices and/or processes described herein can be integrated into an image processing system via a reasonable amount of experimentation. Those having skill in the art will recognize that a typical image processing system generally includes one or more of a system unit housing, a video display device, a memory such as volatile and non-volatile memory, processors such as microprocessors and digital signal processors, computational entities such as operating systems, drivers, and applications programs, one or more interaction devices, such as a touch pad or screen, control systems including feedback loops and control motors (e.g., feedback for sensing lens position and/or velocity; control motors for moving/distorting lenses to give desired focuses. A typical image processing system may be implemented utilizing any suitable commercially available components, such as those typically found in digital still systems and/or digital motion systems.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should NOT be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A system comprising:
a first photo-detector array configured to obstruct a first predefined portion of at least one defined wavelength of light impinging upon said first photo-detector array; and
a second photo-detector array sensitive to the at least one defined wavelength of light, said second photo-detector array positioned proximate to said first photo-detector array, the second photo-detector array having at least one photo-detector in substantial alignment with at least one photo-detector of said first photo-detector array along a path of unobstructed light passing through the first photo-detector array onto the second photo-detector array.

2. The system of claim 1, wherein said first photo-detector array configured to obstruct a first predefined portion of at least one defined wavelength of light impinging upon said first photo-detector array further comprises:

at least one photo-detector in said first photo-detector array constructed to provide an optical filter having a passband including at least one of a red, a blue, and/or a green visible light wavelength.

3. The system of claim 1, wherein said first photo-detector array configured to obstruct a first predefined portion of at least one defined wavelength of light impinging upon said first photo-detector array further comprises:

at least one photo-detector in said first photo-detector array constructed to provide a substantially neutral density filter.

4. The system of claim 1, wherein said first photo-detector array configured to obstruct a first predefined portion of at least one defined wavelength of light impinging upon said first photo-detector array further comprises:

at least one photo-detector in said first photo-detector array constructed to provide a substantially neutral density filter that decreases an intensity of light energy without substantially altering a relative spectral distribution of an unobstructed portion of the light energy.

5. The system of claim 1, wherein said first photo-detector array configured to obstruct a first predefined portion of at least one defined wavelength of light impinging upon said first photo-detector array further comprises:

at least one photo-detector in said first photo-detector array constructed to provide a substantially neutral density filter that filters an entire visible spectrum substantially evenly without substantially influencing at least one of color and/or contrast of an unobstructed portion of the entire visible spectrum.

6. The system of claim 1, wherein said first photo-detector array configured to obstruct a first predefined portion of at least one defined wavelength of light impinging upon said first photo-detector array further comprises:

at least one photo-detector in said first photo-detector array constructed to provide a substantially neutral density filter that utilizes at least one of absorption and/or reflection.

7. The system of claim 1, wherein said first photo-detector array configured to obstruct a first predefined portion of at least one defined wavelength of light impinging upon said first photo-detector array further comprises:

at least one photo-detector in said first photo-detector array constructed to provide a substantially neutral density filter that filters substantially ½ of the light impinging upon said first photo-detector.

8. The system of claim 1, wherein said first photo-detector array configured to obstruct a first predefined portion of at least one defined wavelength of light impinging upon said first photo-detector array further comprises:

at least one photo-detector in said first photo-detector array constructed to provide a substantially neutral density filter that filters a defined portion of photons at least partially composing the light impinging upon said first photo-detector.

9. The system of claim 1, wherein said second photo-detector array sensitive to the at least one defined wavelength of light, said second photo-detector array positioned proximate to said first photo-detector array further comprises:

said second photo-detector array configured to obstruct a second predefined portion of the at least one defined wavelength of light impinging upon said second photo-detector.

10. The system of claim 9, wherein said second photo-detector array configured to obstruct a second predefined portion of the at least one defined wavelength of light impinging upon said second photo-detector further comprises:

at least one of a charge coupled device (CCD) array and/or a complementary metal oxide semiconductor (CMOS) array.

11. The system of claim 9, wherein said second photo-detector array configured to obstruct a second predefined portion of the at least one defined wavelength of light impinging upon said second photo-detector further comprises:

at least one photo-detector in said second photo-detector array constructed to provide an optical filter having a passband including at least one of a red, a blue, and/or a green visible light wavelength.

12. The system of claim 9, wherein said second photo-detector array configured to obstruct a second predefined portion of the at least one defined wavelength of light impinging upon said second photo-detector further comprises:

at least one photo-detector in said second photo-detector array constructed to provide a substantially neutral density filter.

13. The system of claim 9, wherein said second photo-detector array configured to obstruct a second predefined portion of the at least one defined wavelength of light impinging upon said second photo-detector further comprises:

at least one photo-detector in said second photo-detector array constructed to provide a substantially neutral density filter that decreases an intensity of light energy without substantially altering a relative spectral distribution of an unobstructed portion of the light energy.

14. The system of claim 9, wherein said second photo-detector array configured to obstruct a second predefined portion of the at least one defined wavelength of light impinging upon said second photo-detector further comprises:

at least one photo-detector in said second photo-detector array constructed to provide a substantially neutral density filter that filters an entire visible spectrum substantially evenly without substantially influencing at least one of color and contrast of an unobstructed portion of the entire visible spectrum.

15. The system of claim 9, wherein said second photo-detector array configured to obstruct a second predefined portion of the at least one defined wavelength of light impinging upon said second photo-detector further comprises:

at least one photo-detector in said second photo-detector array constructed to provide a substantially neutral density filter that utilizes at least one of absorption and/or reflection.

16. The system of claim 9, wherein said second photo-detector array configured to obstruct a second predefined portion of the at least one defined wavelength of light impinging upon said second photo-detector further comprises:

at least one photo-detector in said second photo-detector array constructed to provide a substantially neutral density filter that filters substantially ½ of the light impinging upon said second photo-detector.

17. The system of claim 9, wherein said second photo-detector array configured to obstruct a second predefined portion of the at least one defined wavelength of light impinging upon said second photo-detector further comprises:

at least one photo-detector in said second photo-detector array constructed to provide a substantially neutral density filter that filters a defined portion of photons at least partially composing the light impinging upon said photo-detector.

18. The system of claim 1, wherein said second photo-detector array sensitive to the at least one defined wavelength of light, said second photo-detector array positioned proximate to said first photo-detector array further comprises:

said second photo-detector array having at least one photo-detector in substantial alignment with at least one photo-detector of said first photo-detector array.

19. The system of claim 1, wherein said second photo-detector array sensitive to the at least one defined wavelength of light, said second photo-detector array positioned proximate to said first photo-detector array further comprises:
a spectrally-dependent filter interposed between said first and said second photo- detector arrays.

20. A method of constructing a system comprising:
forming a first photo-detector array configured to obstruct a first predefined portion of at least one defined wavelength of light impinging thereupon; and
forming a second photo-detector array sensitive to the at least one defined wavelength of light in a vicinity of the first photo-detector array, the second photo-detector array having at least one photo-detector in substantial alignment with at least one photo-detector of said first photo-detector array along a path of unobstructed light passing through the first photo-detector array onto the second photo-detector array.

21. The method of claim 20, wherein said forming a first photo-detector array configured to obstruct a first predefined portion of at least one defined wavelength of light impinging thereupon comprises:
constructing at least one photo-detector in the first photo-detector array to provide a substantially neutral density filter.

22. The method of claim 20, wherein said and forming a second photo-detector array sensitive to the at least one defined wavelength of light comprises:
forming a charge coupled device (CCD) array that includes at least one charge coupled device permeable to a second defined portion of light impinging thereupon.

23. The method of claim 20, wherein said and forming a second photo-detector array sensitive to the at least one defined wavelength of light comprises:
constructing at least one photo-detector in the second photo-detector array to provide a substantially neutral density filter.

24. A method of detecting light comprising:
obstructing a first predefined portion of at least one defined wavelength of light incident upon a first photo-detector array; and
detecting the at least one defined wavelength of light with a photo-detector in a second photo-detector array, the second photo-detector array having at least one photo-detector in substantial alignment with at least one photo-detector of said first photo-detector array along a path of unobstructed light passing through the first photo-detector array onto the second photo-detector array.

25. The method of claim 24, wherein said obstructing a first predefined portion of at least one defined wavelength of light comprises:
obstructing the first predefined portion of the light with a photo-detector in the first photo-detector array without substantially altering a relative spectral distribution of energy in a second unobstructed predefined portion of the light.

26. The method of claim 24, further comprising:
obstructing a second predefined portion of the light with a photo-detector in the second photo-detector array.

27. The method of claim 24, further comprising:
calculating an inferred brightness of light incident upon the first photo-detector.

28. The method of claim 27, wherein said calculating an inferred brightness of light incident upon the first photo-detector further comprises:
calculating the inferred brightness of light incident upon the first photo-detector array in response to light incident upon the second photo detector array.

29. The method of claim 24, further comprising:
selecting one or more calculated inferred brightnesses of light incident upon the first photo-detector array as more probable inferences.

30. The method of claim 29, wherein said selecting one or more calculated inferred brightnesses of light incident upon the first photo-detector array as more probable inferences further comprises:
selecting one or more calculated inferred brightnesses of light incident upon the first photo-detector array as more probable inferences in response to at least one photo-detector indicating a saturation.

31. The method of claim 29, wherein said selecting one or more calculated inferred brightnesses of light incident upon the first photo-detector array as more probable inferences further comprises:
selecting one or more calculated inferred brightnesses of light incident upon the first photo-detector array as more probable inferences in response to at least two calculated brightnesses of light incident upon the first photo-detector array.

\* \* \* \* \*

UNITED STATES PATENT AND TRADEMARK OFFICE
CERTIFICATE OF CORRECTION

| | |
|---|---|
| PATENT NO. | : 7,542,133 B2 |
| APPLICATION NO. | : 11/236414 |
| DATED | : June 2, 2009 |
| INVENTOR(S) | : W. Daniel Hillis et al. |

Page 1 of 1

It is certified that error appears in the above-identified patent and that said Letters Patent is hereby corrected as shown below:

Claim 22, at column 13, line 29, please delete "and".

Claim 23, at column 13, line 35, please delete "and".

Signed and Sealed this

Sixteenth Day of February, 2010

David J. Kappos
*Director of the United States Patent and Trademark Office*